United States Patent
Sasaki et al.

(10) Patent No.: US 9,034,419 B2
(45) Date of Patent: *May 19, 2015

(54) METHOD FOR PRODUCING LIGHT-TRANSMITTING ELECTROMAGNETIC WAVE-SHIELDING FILM, LIGHT-TRANSMITTING ELECTROMAGNETIC WAVE-SHIELDING FILM AND PLASMA DISPLAY PANEL USING THE SHIELDING FILM

(75) Inventors: Hirotomo Sasaki, Minami-ashigara (JP); Ryou Nishizakura, Minami-ashigara (JP); Kiyoshi Morimoto, Minami-ashigara (JP); Shunji Takada, Minami-ashigara (JP)

(73) Assignee: FUJIFILM Corporation, Tokyo (JP)

(*) Notice: Subject to any disclaimer, the term of this patent is extended or adjusted under 35 U.S.C. 154(b) by 791 days.

This patent is subject to a terminal disclaimer.

(21) Appl. No.: 12/341,811

(22) Filed: Dec. 22, 2008

(65) Prior Publication Data

US 2009/0110912 A1 Apr. 30, 2009

Related U.S. Application Data

(63) Continuation of application No. 10/743,437, filed on Dec. 23, 2003, now Pat. No. 7,537,800.

(30) Foreign Application Priority Data

Dec. 27, 2002 (JP) ................................. 2002-378967

(51) Int. Cl.
*B05D 7/00* (2006.01)
*H05K 9/00* (2006.01)
*C03C 17/10* (2006.01)
*C03C 17/36* (2006.01)
*G03C 5/58* (2006.01)
*H01J 9/20* (2006.01)
*H01J 11/44* (2012.01)
*H01J 29/86* (2006.01)
*H05K 3/10* (2006.01)
*G02F 1/1333* (2006.01)
*G03C 1/08* (2006.01)

(52) U.S. Cl.
CPC .............. *H05K 9/0096* (2013.01); *C03C 17/10* (2013.01); *C03C 17/36* (2013.01); *C03C 17/3676* (2013.01); *C03C 2217/256* (2013.01); *C03C 2217/445* (2013.01); *C03C 2217/475* (2013.01); *C03C 2217/93* (2013.01); *C03C 2218/11* (2013.01); *G02F 2001/133334* (2013.01); *G03C 1/08* (2013.01); *G03C 5/58* (2013.01); *H01J 9/205* (2013.01); *H01J 11/44* (2013.01); *H01J 29/868* (2013.01); *H01J 2211/446* (2013.01); *H01J 2229/8636* (2013.01); *H01J 2329/869* (2013.01); *H05K 3/106* (2013.01)

(58) Field of Classification Search
USPC .......................................... 427/99.5, 331, 553
See application file for complete search history.

(56) References Cited

U.S. PATENT DOCUMENTS

| | | | |
|---|---|---|---|
| 3,977,877 A | 8/1976 | Oishi | |
| 3,989,522 A | 11/1976 | Poot et al. | |
| 4,160,669 A | 7/1979 | Habu et al. | |
| 4,362,796 A | 12/1982 | Monroe | |
| 4,387,154 A | 6/1983 | Whitmore | |
| 4,631,214 A | 12/1986 | Hasegawa | |
| 4,831,491 A | 5/1989 | Mueller et al. | |
| 4,845,310 A | 7/1989 | Postupack | |
| 4,927,897 A | 5/1990 | Kawata et al. | |
| 5,288,313 A | 2/1994 | Portner | |
| 5,957,828 A | 9/1999 | Hayashi | |
| 6,197,408 B1 | 3/2001 | Kanbara et al. | |
| 6,262,364 B1 | 7/2001 | Yoshikawa et al. | |
| 6,300,034 B1 * | 10/2001 | Blanchard et al. | 430/204 |
| 6,451,433 B1 | 9/2002 | Oka et al. | |
| 6,787,204 B2 | 9/2004 | Chaussade et al. | |
| 7,060,241 B2 | 6/2006 | Glatkowski | |
| 2001/0015279 A1 | 8/2001 | Marutsuka | |
| 2001/0045362 A1 | 11/2001 | Deng et al. | |

(Continued)

FOREIGN PATENT DOCUMENTS

| | | |
|---|---|---|
| EP | 0887834 A2 | 12/1998 |
| EP | 1176436 A1 | 1/2002 |
| GB | 2122764 A | 1/1984 |

(Continued)

OTHER PUBLICATIONS

Introduction of Gelatin, Nov. 1991, Nitta gelatin Inc.
European Office Action for EPA 03029822.8 dated Jun. 24, 2011.
Office Action for JP 2009-051492 dated Jun. 7, 2011 (A91054J)—Japanese and English Languages.
Office Action for JP 2009-051491 dated Jun. 7, 2011 (A91053J)—Japanese and English Languages.

*Primary Examiner* — Robert Vetere
(74) *Attorney, Agent, or Firm* — Sughrue Mion, PLLC

(57) ABSTRACT

A silver salt-containing layer containing a silver salt and provided on a support is exposed and developed to form a metal silver portion and a light-transmitting portion, and then the metal silver portion is further subjected to physical development and/or plating to form a conductive metal portion consisting of the metal silver portion carrying conductive metal particles. A method for producing a light-transmitting electromagnetic wave-shielding film which enables production of an electromagnetic wave-shielding material simultaneously having high EMI-shielding property and high transparency in a fine line pattern and also enables mass production of such films at a low cost, and a light-transmitting electromagnetic wave-shielding film obtained by the production method and free from the problem of moire are provided.

18 Claims, No Drawings

(56) References Cited

U.S. PATENT DOCUMENTS

2004/0023253 A1* 2/2004 Kunwar et al. ............... 435/6
2004/0112175 A1   6/2004 Ishihara et al.

FOREIGN PATENT DOCUMENTS

| JP | 64-065180 A | 3/1989 | | |
|----|-------------|--------|----|---|
| JP | 02-127603 A | 5/1990 | | |
| JP | 4-44026 | * | 2/1992 | ............. G03C 1/005 |
| JP | 05-210231 A | 8/1993 | | |
| JP | H06-194762 | 7/1994 | | |
| JP | H07-043868 | 2/1995 | | |
| JP | 07-128517 A | 5/1995 | | |
| JP | 11-072603 A | 3/1999 | | |
| JP | 11170421 A | 6/1999 | | |
| JP | 11-340682 A | 12/1999 | | |
| JP | 2000149773 A | 5/2000 | | |
| JP | 2001-281822 A | 10/2001 | | |
| JP | 2002-223095 A | 8/2002 | | |
| JP | 2002-323861 A | 11/2002 | | |
| JP | 2003-273574 A | 9/2003 | | |
| WO | 02081131 A1 | 10/2002 | | |

\* cited by examiner

METHOD FOR PRODUCING LIGHT-TRANSMITTING ELECTROMAGNETIC WAVE-SHIELDING FILM, LIGHT-TRANSMITTING ELECTROMAGNETIC WAVE-SHIELDING FILM AND PLASMA DISPLAY PANEL USING THE SHIELDING FILM

This is a continuation of application Ser. No. 10/743,437 filed Dec. 23, 2003. The entire disclosure of the prior application, application Ser. No. 10/743,437, is hereby incorporated by reference.

BACKGROUND OF THE INVENTION

1. Field of the Invention

The present invention relates to a method for producing an electromagnetic wave-shielding material which shields electromagnetic waves generated from front faces of displays such as CRT (cathode ray tube), PDP (plasma display panel), liquid crystal display, EL (electroluminescence) display and FED (field emission display), microwave oven, electronic equipment, printed wiring board and so forth and has transparency, and an electromagnetic wave-shielding material having transparency obtained by the production method.

2. Description of the Background

In recent years, electromagnetic interferences (EMI) have rapidly increased with the increase in utilization of various electric installations and electronics-applied equipments. It is pointed out that EMI not only causes malfunctions and damages to electronic or electric equipments, but also damages health of operators of these apparatuses. Therefore, it is required to suppress intensity of electromagnetic waves emitted from electronic or electric equipments within the range of standards or regulations.

As a countermeasure for the aforementioned EMI, it is necessary to shield electromagnetic waves, and it is evident that the property of metals that they do not transmit electromagnetic waves can be utilized for that purpose. For example, adopted are a method of using a metal body or a highly conductive body as a casing, a method of inserting a metal plate between circuit boards, a method of covering a cable with a metal foil and so forth. However, since an operator needs to recognize characters etc. displayed on a screen of CRT or PDP, transparency of display is required. Therefore, all of the aforementioned methods were unsuitable as a method for shielding electromagnetic waves, since the aforementioned methods often provide opaque display front faces.

In particular, since PDP generates electromagnetic waves in a larger amount compared with CRT or the like, stronger electromagnetic wave shielding ability is desired. The electromagnetic wave-shielding ability can be conveniently represented in terms of a surface resistance value. While a surface resistance value of about 300 Ω/sq or smaller is required for a light-transmitting electromagnetic wave-shielding material for CRT, the value of 2.5 Ω/sq or lower is required for a light-transmitting electromagnetic wave-shielding material for PDP, and it is quite necessarily 1.5 Ω/sq or lower, more desirably 0.1 Ω/sq or lower, in a plasma television utilizing PDP as a commercial product. Thus, extremely high conductivity is required.

Further, as for the required level of transparency, the transparency is required to be about 70% or higher for CRT and 80% or higher for PDP, and further higher transparency is desired.

In order to overcome the aforementioned problems, various materials and methods such as those mentioned below have been so far proposed to simultaneously achieve electromagnetic wave-shielding property and transparency by utilizing metal mesh having apertures.

(1) Conductive Fibers

For example, Japanese Patent Laid-open Publication (Kokai) No. 5-327274 discloses an electromagnetic wave-shielding material comprising conductive fibers. However, this shielding material has a drawback that it has a thick mesh line width, and therefore when a display screen is shielded with this shielding material, the screen becomes dark, and thus characters displayed on the display are hard to see.

(2) Electroless Plating-Processed Mesh

A method has been proposed which comprises printing an electroless plating catalyst in a grid pattern by a printing method and then performing electroless plating (for example, Japanese Patent Laid-open Publication Nos. 11-170420, 5-283889 etc.). However, the line width of the printed catalyst is as large as about 60 μm and is not suitable for use in a display that requires a relatively small line width and a precise pattern.

Further, a method is proposed which comprises applying a photoresist containing an electroless plating catalyst, performing exposure and development to form a pattern of the electroless plating catalyst and then performing electroless plating (for example, Japanese Patent Laid-open Publication No. 11-170421). However, the visible light transmittance of the conductive film is 72%, which means insufficient transparency. In addition, since extremely expensive palladium must be used as the electroless plating catalyst, most part of which is removed after the exposure, this method also suffers from a problem of production cost.

(3) Mesh Formed by Etching Utilizing Photolithography

A method has been proposed which comprises forming a thin metal film mesh on a transparent substrate by etching utilizing photolithography (for example, Japanese Patent Laid-open Publication Nos. 2003-46293, 2003-23290, 5-16281, 10-338848 etc.). Since this method enables fine processing, it has advantages that it enables production of a mesh having a high aperture ratio (high transmittance), and the mesh can shield even a strong electromagnetic wave emission. However, this method suffers from problems of the time-consuming and complicated production process and thus high production cost. Moreover, it is known that this mesh has a problem that, since it is produced by etching, the width of the intersectional points in the grid pattern is thicker than that of the straight line portions. Furthermore, the problem of moire is also pointed out, and improvement of this problem has been desired.

Hereafter, the prior art concerning methods of forming a conductive metal silver pattern using a silver salt will be explained.

Light-sensitive materials using a silver salt have conventionally been utilized mainly as materials for recording and circulating images and pictures. For example, they are used for photographic films such as negative color films, black-and-white negative films, films for movies and color reversal films, photographic printing paper such as color paper and black-and-white printing paper and so forth, and emulsion masks (photomasks) and so forth utilizing the fact that a metal silver pattern can be formed as an exposure pattern are commonly used. In all of these, images obtained by exposure and development of a silver salt have values, and the images themselves are utilized.

On the other hand, because developed silver obtained from a silver salt is metal silver, it is considered that the conductivity of metal silver may be utilized depending on the production method. Several proposals utilizing such a principle have been known from old days, and the examples of disclosing specific methods for forming a conductive silver thin film include the followings. In the 1960s, a method for forming a metal silver thin film pattern by a silver salt diffusion transfer process, in which silver is deposited on physical development nuclei, was disclosed in Japanese Patent Publication (Kokoku) No. 42-23746. It is also disclosed that a uniform silver thin film prepared by utilizing a similar silver salt diffusion transfer process and not showing light transmission has a function of decreasing microwaves in Japanese Patent Publication No. 43-12862.

Moreover, a method of utilizing the above principle as it is to conveniently perform light exposure and development using an instant black-and-white slide film and thereby form a conductive pattern is disclosed in Analytical Chemistry, Vol. 72, 645, 2000 and International Patent Publication WO01/51276. Further, a method based on the principle of silver salt diffusion transfer process for forming a conductive silver film that can be used for display electrodes of plasma displays is disclosed in Japanese Patent Publication Laid-open No. 2000-149773.

However, any method has not been known at all for forming conductive metal silver by such methods to shield electromagnetic waves emitted from image display surfaces of displays including CRT, PDP etc. without inhibiting the image display.

In the methods described in the five of references mentioned above, specially prepared physical development nuclei are uniformly provided in a layer in which a conductive metal pattern is formed irrespective of the exposed portion and unexposed portion. Therefore, they suffer from a problem that opaque physical development nuclei remain in an exposed portion in which the metal silver is not formed, and thus light transmission is degraded. The aforementioned problem is serious particularly in a case that the metal pattern material is used as a light-transmitting electromagnetic wave-shielding material for a display such as CRT and PDP.

Moreover, it is also difficult to obtain high conductivity by those methods, and attempts of obtaining a thick silver film for high conductivity should be accompanied by a problem of degradation of transparency. Therefore, even if the aforementioned silver salt diffusion transfer process is used as it is, a light-transmitting electromagnetic wave-shielding material showing superior light transmission and conductivity and thus suitable for shielding electromagnetic waves from image display surfaces of electronic display equipments cannot be obtained.

Further, if the silver salt diffusion transfer process is not used, and conductivity is imparted by using a commercially available usual negative film through development, physical development and plating processes, obtainable conductivity and transparency are insufficient for use as a light-transmitting electromagnetic wave-shielding material for CRT or PDP.

As described above, any method has not been known at all for forming a conductive metal silver from a silver salt light-sensitive material as means for shielding electromagnetic waves emitted by electronic display equipments, and if the known silver salt diffusion transfer process is used as it is for electromagnetic wave shielding of displays, transparency and conductivity becomes insufficient.

As described above, conventional electromagnetic wave-shielding materials and methods for producing them each have problems.

In recent years, an electromagnetic wave-shielding plate obtained by forming a mesh composed of a metal thin film on a transparent glass or plastic substrate surface, in particular, has been increasingly used as an electromagnetic wave-shielding material for display panels such as PDP, since it has extremely high electromagnetic wave-shielding property and favorable light transmittance. However, since its price is extremely high, reduction of the production cost has been strongly desired. Furthermore, since high lightness of images is required for a display, light transmittance close to 100% has been required. However, when the aperture ratio (ratio of portions not having fine lines constituting a mesh with respect to the total area) is increased in order to improve the light transmittance, conductivity becomes lower, and thus electromagnetic wave-shielding effect is degraded. Therefore, it has been extremely difficult to simultaneously improve conductivity (electromagnetic wave-shielding effect) and light transmittance with conventional techniques. Moreover, since the material is installed on the front of the image display surface of a display, moire is generated, and it has constituted a problem.

SUMMARY OF THE INVENTION

The present invention has been achieved in view of the state of the art described above. An object of the present invention is to provide a method for producing an electromagnetic wave-shielding material simultaneously exhibiting high EMI-shielding property and high transparency and free from moire with easy formation of fine line pattern at a low cost in a large amount. Another object of the present invention is to provide a light-transmitting electromagnetic wave-shielding film obtained by the aforementioned production method.

The inventors of the present invention assiduously studied aiming at simultaneously obtaining high EMI-shielding property and high transparency. As a result, they found that the aforementioned objects could be effectively achieved by the following production method and light-transmitting electromagnetic wave-shielding film and thus accomplished the present invention.

That is, the objects of the present invention are achieved by the following production methods.

(1) A method for producing a light-transmitting electromagnetic wave-shielding film having a conductive metal portion and a light-transmitting portion, which comprises exposing and developing a silver salt-containing layer containing a silver salt and provided on a support to form a metal silver portion and the light-transmitting portion and further subjecting the metal silver portion to physical development and/or plating to form the conductive metal portion consisting of the metal silver portion carrying conductive metal particles.

(2) A method for producing a light-transmitting electromagnetic wave-shielding film having a conductive metal portion and a light-transmitting portion, which comprises exposing and developing a silver salt-containing layer containing a silver salt and provided on a support to form a metal silver portion and the light-transmitting portion, subjecting the metal silver portion to physical development and/or plating to form the conductive metal portion consisting of the metal silver portion carrying conductive metal particles and further subjecting the light-transmitting portion and the conductive metal portion to an oxidization treatment.

(3) A method for producing a light-transmitting electromagnetic wave-shielding film having a conductive metal portion and a light-transmitting portion, which comprises exposing and developing a silver salt-containing layer containing a silver salt and provided on a support to form a metal silver portion and the light-transmitting portion, subjecting the metal silver portion and the light-transmitting portion to an oxidization treatment and further subjecting the metal silver portion to physical development and/or plating to form the conductive metal portion consisting of the metal silver portion carrying conductive metal particles.

(4) A method for producing a light-transmitting electromagnetic wave-shielding film having a conductive metal portion and a light-transmitting portion, which comprises exposing and developing a silver salt-containing layer containing a silver salt and provided on a support to form a metal silver portion and the light-transmitting portion, subjecting the metal silver portion and the light-transmitting portion to an oxidization treatment, further subjecting the metal silver portion to physical development and/or plating to form the conductive metal portion consisting of the metal silver portion carrying conductive metal particles and then further subjecting the conductive metal portion and the light-transmitting portion to an oxidization treatment.

(5) A method for producing a light-transmitting electromagnetic wave-shielding film having a conductive metal portion and a light-transmitting portion, which comprises exposing and developing a silver salt-containing layer containing a silver salt and provided on a support to form a metal silver portion and the light-transmitting portion, treating the metal silver portion with a solution containing Pd and further subjecting the metal silver portion to physical development and/or plating to form the conductive metal portion consisting of the metal silver portion carrying conductive metal particles.

(6) The method for producing a light-transmitting electromagnetic wave-shielding film according to any one of (1) to (5), wherein the metal silver portion is patterned.

(7) The method for producing a light-transmitting electromagnetic wave-shielding film according to any one of (1) to (6), wherein the silver salt in the silver salt-containing layer is a silver halide.

(8) The method for producing a light-transmitting electromagnetic wave-shielding film according to (7), wherein the silver halide consists mainly of silver bromide.

(9) The method for producing a light-transmitting electromagnetic wave-shielding film according to (7) or (8), wherein the silver halide contains a rhodium compound and/or an iridium compound.

(10) The method for producing a light-transmitting electromagnetic wave-shielding film according to any one of (7) to (9), wherein the silver halide contains Pd(II) ions and/or Pd metal.

(11) The method for producing a light-transmitting electromagnetic wave-shielding film according to (10), wherein the silver halide contains Pd(II) ions and/or Pd metal in the vicinity of surface layers of silver halide grains.

(12) The method for producing a light-transmitting electromagnetic wave-shielding film according to any one of (1) to (11), wherein the silver salt-containing layer has an Ag/binder volume ratio of 1/4 or higher.

(13) The method for producing a light-transmitting electromagnetic wave-shielding film according to any one of (1) to (11), wherein the silver salt-containing layer has an Ag/binder volume ratio of 1/2 or higher.

(14) The method for producing a light-transmitting electromagnetic wave-shielding film according to any one of (1) to (13), wherein the silver salt in the silver salt-containing layer has a diameter as sphere of 0.1 to 100 nm.

(15) The method for producing a light-transmitting electromagnetic wave-shielding film according to any one of (1) to (14), wherein the exposure is performed by a scanning exposure method using a laser beam.

(16) The method for producing a light-transmitting electromagnetic wave-shielding film according to any one of (1) to (15), wherein the exposure is performed through a photomask.

(17) The method for producing a light-transmitting electromagnetic wave-shielding film according to any one of (1) to (16), wherein a developer used for the development of the silver salt-containing layer contains an image quality improver.

(18) The method for producing a light-transmitting electromagnetic wave-shielding film according to (17), wherein the image quality improver is a nitrogen-containing heterocyclic compound.

(19) The method for producing a light-transmitting electromagnetic wave-shielding film according to any one of (1) to (18), wherein the developer used for the development of the silver salt-containing layer is a lith developer.

(20) The method for producing a light-transmitting electromagnetic wave-shielding film according to any one of (1) to (19), wherein an exposed portion after the development contains the metal silver at a content of 50% by weight or more based on the weight of silver contained in the exposed portion before the exposure.

(21) The method for producing a light-transmitting electromagnetic wave-shielding film according to any one of (1) to (20), wherein the plating is performed by electroless plating.

(22) The method for producing a light-transmitting electromagnetic wave-shielding film according to any one of (1) to (20), wherein the plating is performed by electrolytic plating.

(23) The method for producing a light-transmitting electromagnetic wave-shielding film according to any one of (1) to (20), wherein the plating is performed by electroless plating and subsequent electrolytic plating.

(24) The method for producing a light-transmitting electromagnetic wave-shielding film according to (21) or (23), wherein the electroless plating is electroless copper plating.

(25) The method for producing a light-transmitting electromagnetic wave-shielding film according to any one of (1) to (24), wherein gradation of the silver salt-containing layer after the development exceeds 4.0.

(26) The method for producing a light-transmitting electromagnetic wave-shielding film according to any one of (1) to (25), wherein the surface of the conductive metal portion is further subjected to a blackening treatment.

(27) The method for producing a light-transmitting electromagnetic wave-shielding film according to any one of (1) to (26), wherein the light-transmitting portion does not substantially contain physical development nuclei.

(28) The method for producing a light-transmitting electromagnetic wave-shielding film according to any one of (1) to (27), wherein the light-transmitting electromagnetic wave-shielding film has a surface resistance of 2.5 Ω/sq or lower after the physical development and/or plating, and/or the light-transmitting portion has a transmittance of 95% or higher.

Further, the object of the present invention is achieved by a light-transmitting electromagnetic wave-shielding film and a plasma display panel including the following embodiments.

(29) A light-transmitting electromagnetic wave-shielding film having a conductive metal portion and a light-transmitting portion, which is obtainable by the production method according to any one of (1) to (28).

(30) The light-transmitting electromagnetic wave-shielding film according to (29), wherein weight of silver contained in the conductive metal portion accounts for 50% by weight or more of the total weight of metal components contained in the conductive metal portion.

(31) The light-transmitting electromagnetic wave-shielding film according to (29), wherein the total weight of silver, copper and palladium contained in the conductive metal portion accounts for 80% by weight or more of the total weight of the all metal components.

(32) The light-transmitting electromagnetic wave-shielding film according to any one of (29) to (31), wherein the conductive metal portion is in the shape of a mesh.

(33) The light-transmitting electromagnetic wave-shielding film according to (32), wherein the conductive metal portion has an aperture ratio of 85% or higher.

(34) The light-transmitting electromagnetic wave-shielding film according to any one of (29) to (33), wherein a layer comprising the conductive metal particles carried by the conductive metal portion has a thickness of 0.1 μm or larger and less than 5 μm and a surface resistance value of 3 Ω/sq or smaller.

(35) The light-transmitting electromagnetic wave-shielding film according to any one of (29) to (33), wherein the conductive metal portion has a line width of 0.1 μm or larger and smaller than 18 μm.

(36) The light-transmitting electromagnetic wave-shielding film according to any one of (29) to (34), wherein the conductive metal portion has a line width of 0.1 μm or larger and smaller than 14 μm.

(37) The light-transmitting electromagnetic wave-shielding film according to any one of (29) to (34), wherein the conductive metal portion has a line width of 0.1 μm or larger and smaller than 10 μm.

(38) The light-transmitting electromagnetic wave-shielding film according to any one of (29) to (34), wherein the conductive metal portion has a line width of 0.1 μm or larger and smaller than 7 μm.

(39) The light-transmitting electromagnetic wave-shielding film according to any one of (29) to (38), wherein the light-transmitting portion has a transmittance of 95% or higher.

(40) The light-transmitting electromagnetic wave-shielding film according to any one of (29) to (38), wherein the light-transmitting portion has a transmittance of 98% or higher.

(41) A plasma display panel having the light-transmitting electromagnetic wave-shielding film according to any one of (29) to (40).

(42) A method for producing a light-transmitting electromagnetic wave-shielding film having a conductive metal portion and a light-transmitting portion, which comprises exposing and developing a silver salt-containing layer containing a silver salt and provided on a support to form a metal silver portion in an exposed portion and the light-transmitting portion in an unexposed portion and further subjecting the metal silver portion to physical development and/or plating to form the conductive metal portion consisting of the metal silver portion carrying conductive metal particles.

BEST MODE FOR CARRYING OUT THE INVENTION

First, the features of the method of the present invention will be explained in comparison with other conventionally known methods which are the closest to the method of the present invention.

In the conventional methods utilizing the silver salt diffusion transfer process (the methods described in Analytical Chemistry, Vol. 72, 645, 2000, International Patent Publication WO01/51276 and Japanese Patent Laid-open Publication (Kokai) No. 2000-149773), a physical development nucleus layer is uniformly formed for a metal image portion and a light-transmitting portion. Therefore, physical development nuclei remain also in the light-transmitting portion in addition to the metal image portion. Thus, the silver salt diffusion transfer process suffers from a fundamental problem that transmission in the light-transmitting portion is degraded because the remaining physical development nuclei absorb light.

The aforementioned problem is serious particularly in a light-transmitting electromagnetic wave-shielding material for a display, which requires high transmission. On the other hand, in the method of the present invention, metal silver functioning as a physical development nuclei is generated only in an exposed portion, and not generated in an unexposed portion serving as a light-transmitting portion. Therefore, it has an advantage that the transmittance in the light-transmitting portion can be basically increased.

In the present invention, the term "transmittance" of the light-transmitting portion refers to a transmittance represented by the minimum transmittance for a wavelength range of 380 to 780 nm excluding change of the transmittance due to light absorption and reflection of a support, and is represented as (transmittance of light-transmitting electromagnetic wave-shielding material)/(transmittance of support)×100(%). The transmittance is preferably 90% or higher, more preferably 95% or higher, further preferably 97% or higher, still further preferably 98% or higher, most preferably 99% or higher.

Meanwhile, it is described in International Patent Publication WO01/51276 that conductivity can be imparted through development, physical development and plating processes by using a commercially available photographic film without utilizing the silver salt diffusion transfer process. In fact, a conductive metal film can be formed based on the description of the aforementioned document. However, conductivity and transparency of such a metal film both become poorer than those obtained by using the silver salt diffusion transfer process, and are not sufficient for a light-transmitting electromagnetic wave-shielding material for use in CRT, PDP or the like. Furthermore, a physical development nucleus layer for forming a metal image is specially provided in the silver salt diffusion transfer process, whereas physical development nuclei are generated within a silver halide emulsion layer and embedded in a large amount of binder in commercially available photographic films.

Hereafter, the production method and light-transmitting electromagnetic wave-shielding film of the present invention will be explained in further detail.

In the present specification, the ranges indicated with "to" mean ranges including numerical values before and after "to" as the lower limit values and the upper limit values, respectively.

[Support]

In the present invention, a plastic film, plastic plate, glass or the like can be used as a support.

As the raw material of the plastic film and plastic plate, polyesters such as polyethylene terephthalate (PET) and polyethylene naphthalate, polyolefins such as polyethylene (PE), polypropylene (PP), polystyrene and EVA, vinyl resins such as polyvinyl chloride and polyvinylidene chloride, polyether ether ketone (PEEK), polysulfone (PSF), polyether sulfone (PES), polycarbonate (PC), polyamide, polyimide, acrylic resin, triacetyl cellulose (TAC) and so forth can be used.

In view of transparency, heat resistance, ease of handling and price, the plastic film is preferably a polyethylene terephthalate film.

Since an electromagnetic wave-shielding material for a display requires transparency, the support preferably has high transparency. The total visible light transmittance of a plastic film or plastic plate used for this purpose is preferably 70 to 100%, more preferably 85 to 100%, more preferably 90 to 100%. Further, in the present invention, the aforementioned plastic film and plastic plate may be colored in such a degree that the object of the present invention should not be hindered.

In the present invention, the plastic film and plastic plate can be used as a monolayer, or can also be used as a multilayer film comprising two or more layers in combination.

When the support is a glass plate, the type thereof is not particularly limited. However, when the support is used for shielding of electromagnetic waves for a display, a reinforced glass plate having a reinforced layer on the surface is preferably used. The reinforced glass can more effectively prevent damage compared with unreinforced glass. Further, reinforced glass obtained by the air-cooling method is preferred in view of safety, since crushed pieces thereof are small and do not have sharp end surfaces, even if it is broken.

[Silver Salt-Containing Layer]

In the present invention, a layer containing a silver salt (silver salt-containing layer) is disposed on the support as an optical sensor. The silver salt-containing layer can contain a binder, solvent and so forth in addition to the silver salt.

<Silver Salt>

Examples of the silver salt used in the present invention include inorganic silver salts such as silver halides and organic silver salts such as silver acetate. Among these, silver halides, which exhibit superior characteristics as an optical sensor, are preferably used.

Silver halides preferably used in the present invention will be further explained below.

In the present invention, silver halides are used in order that they may function as an optical sensor. Techniques for using silver halides in silver salt photographic films, photographic paper, films for printing plate making, emulsion masks for photomask and so forth can also be used in the present invention as they are.

Halogen elements contained in the silver halides may be any of chlorine, bromine, iodine and fluorine, or a combination thereof. For example, silver halides consist mainly of AgCl, AgBr or AgI are preferably used. Among these, silver halides consisting mainly of AgBr are more preferably used.

The expression "silver halides consisting mainly of AgBr (silver bromide)" used herein means silver halides of which molar fraction of bromide ions in the silver halide composition is 50% or more. Such silver halide grains consisting mainly of AgBr may contain iodide ions and chloride ions in addition to bromide ions.

Silver halides are in the shape of solid grain. In view of image quality of a patterned metal silver layer formed after exposure and development, the average grain size of silver halides is preferably 0.1 to 1000 nm (1 μm), more preferably 0.1 to 100 nm, further preferably 1 to 50 nm, in terms of a diameter as sphere. The diameter as sphere of silver halide grain means a diameter of a grain having a spherical shape and the same volume.

The shape of the silver halide particle is not particularly limited, and the particle can be of various shapes, for example, spherical, cubic, tabular (hexagonal table, triangular table, square table etc.), octahedral, tetradecahedral shapes and so forth.

Silver halides used in the present invention may further contain other elements. For example, it is useful to dope metal ions used for a photographic emulsion to obtain an emulsion providing high contrast. In particular, transition metal ions such as rhodium ions and iridium ions are preferably used, since an exposed portion and an unexposed portion are more clearly distinguished upon formation of a metal silver image.

Transition metal ions represented by rhodium ions and iridium ions may be used as compounds having various ligands. Examples of such ligands include cyanide ions, halogen ions, thiocyanate ions, nitrosyl ions, water, hydroxide ions and so forth. Specific examples as a compound include $K_3Rh_2Br_9$, $K_2IrCl_6$ and so forth.

In the present invention, the content of a rhodium compound and/or iridium compound contained in the silver halide is preferably $10^{-10}$ to $10^{-2}$ mol/mol Ag, more preferably $10^{-9}$ to $10^{-3}$ mol/mol Ag, based on the molar number of silver in the silver halide.

In addition, silver halides containing Pd(II) ions and/or Pd metal can also be preferably used in the present invention. While Pd may be uniformly distributed in the silver halide grains, it is preferably contained in the vicinity of the surface layers of the silver halide grains. The expression "Pd is contained in the vicinity of the surface layers of the silver halide grains" used herein means that the grains have a layer having a higher content of palladium within a thickness of 50 nm from the surfaces of the silver halide grains in the depth direction compared with the other portions. Such silver halide grains can be formed by adding Pd during formation of the silver halide grains. Pd is preferably added after adding 50% or more of the total amount of silver ions and halogen ions to be added. It is also preferable to provide Pd(II) ions in silver halide surface layers by a method of adding the ions during post-ripening or the like.

These Pd-containing silver halide grains contribute to reduction of the production cost by increasing the speeds of physical development and electroless plating and thereby improving productivity of the desired electromagnetic wave-shielding material. Pd is well known and used as an electroless plating catalyst. In the present invention, Pd can be localized in the surface layers of the silver halide grains, and therefore extremely expensive Pd can be saved.

In the present invention, the content of Pd ions and/or Pd metal contained in the silver halide is preferably $10^{-4}$ to 0.5 mol/mol Ag, more preferably 0.01 to 0.3 mol/mol Ag, based on the molar number of silver in the silver halide.

Examples of the Pd compound to be used include $PdCl_4$, $Na_2PdCl_4$ and so forth.

In the present invention, the silver halide grains may be subjected to chemical sensitization performed for photographic emulsions in order to improve sensitivity as an optical sensor. As the chemical sensitization, for example, noble metal sensitization such as gold sensitization, chalcogen sensitization such as sulfur sensitization, reduction sensitization and so forth can be utilized.

Preferred examples of the emulsions that can be used for the present invention include emulsions for color negative films described in the examples of Japanese Patent Laid-open Publication Nos. 11-305396, 2000-321698, 13-281815 and 2002-72429, emulsions for color reversal films described in Japanese Patent Laid-open Publication No. 2002-214731, emulsions for color photographic paper described in Japanese Patent Laid-open Publication No. 2002-107865 and so forth.

<Binder>

In the silver salt-containing layer of the present invention, a binder can be used in order to uniformly disperse the silver salt grains and assist adhesion of the silver salt-containing layer and the support. In the present invention, although either water-insoluble polymers or water-soluble polymers can be used as the binder, water-soluble polymers are preferably used.

Examples of the binder include gelatin, polyvinyl alcohol (PVA), polyvinylpyrrolidine (PVP), polysaccharides such as starch, cellulose and derivatives thereof, polyethylene oxide, polyvinylamine, chitosan, polylysine, polyacrylic acid, polyalginic acid, polyhyaluronic acid, carboxycellulose and so forth. These substances have neutral, anionic or cationic property depending on ionicity of functional groups.

The content of the binder contained in the silver salt-containing layer of the present invention is not particularly limited and can be suitably determined within a range in which dispersibility and adhesion can be exerted. The content of the binder in the silver salt-containing layer is preferably 1/4 to 100, more preferably 1/3 to 10, further preferably 1/2 to 2, most preferably 1/1 to 2, in terms of a volume ratio of Ag/binder. If the binder is contained in the silver salt-containing layer at an Ag/binder volume ratio of 1/4 or higher, the metal particles are easily brought into contact with one another during the physical development and/or plating process, and thereby high conductivity can be obtained. Thus, such a content is preferred.

<Solvent>

The solvent used in the silver salt-containing layer of the present invention is not particularly limited. Examples include, for example, water, organic solvents (for example, alcohols such as methanol, ketones such as acetone, amides such as formamide, sulfoxides such as dimethyl sulfoxide, esters such as ethyl acetate, ethers etc.), ionic liquids and mixed solvents thereof.

The content of the solvent used for the silver salt-containing layer of the present invention is preferably in the range of 30 to 90% by weight, further preferably in the range of 50 to 80% by weight, based on the total weight of the silver salt, binder etc. contained in the aforementioned silver-containing layer.

[Light Exposure]

In the present invention, the silver salt-containing layer provided on the support is exposed. The exposure can be performed by using electromagnetic waves. Examples of the electromagnetic waves include lights such as visible lights and ultraviolet rays, radiation such as X-rays and so forth. Further, for the exposure, a light source having wavelength distribution or a light source having a specific wavelength may be used.

As for the light source, for example, scanning exposure using a cathode ray tube (CRT) can be mentioned. The cathode ray tube exposure apparatus is more convenient and compact and requires a lower cost compared with apparatuses using a laser. Further, adjustment of optical axes and colors is also easy. For the cathode ray tube used for imagewise exposure, various illuminants that emit lights in a certain spectrum region are used as required. For example, one or more types of red illuminant, green illuminant and blue illuminant are used in combination. The spectrum region is not limited to the aforementioned red, green and blue regions, and fluorescent substances that emit lights in the yellow, orange, purple or infrared region can also be used. In particular, a cathode ray tube that utilizes a mixture of these illuminants to emit a white light is often used. Further, an ultraviolet lamp is also preferred. The g-line of a mercury lamp, i-line of a mercury lamp and so forth can also be used.

Further, in the present invention, the exposure can be performed by using various laser beams. For example, for the exposure in the present invention, a scanning exposure method using a monochromatic high density light such as a light emitted by gas laser, light emitting diode, semiconductor laser or second harmonic generation (SHG) light source using a semiconductor laser or a solid-state laser using a semiconductor laser as an excitation light source and nonlinear optical crystals in combination is preferably used. Further, KrF excimer laser, ArF excimer laser, F2 laser and so forth can also be used. In order to make the system compact and inexpensive, the exposure is preferably performed by using a semiconductor laser or a second harmonic generation (SHG) light source using a semiconductor laser or a solid-state laser and nonlinear optical crystals in combination. In particular, in order to design a compact, inexpensive, long-life and highly stable apparatus, the exposure is preferably performed by using a semiconductor laser.

As a laser light source, preferred are, specifically, a blue semiconductor laser having a wavelength of 430 to 460 nm (announced by Nichia Corporation at the 48th Lecture Meeting of Applied Physics-related Union, March 2001), a green laser having a wavelength of about 530 nm generated by converting a wavelength of a semiconductor laser (oscillation wavelength: about 1060 nm) using $LiNbO_3$ SHG crystals having a waveguide-like reversed domain structure, a red semiconductor laser having a wavelength of about 685 nm (Hitachi, Type No. HL6738MG), a red semiconductor laser having a wavelength of about 650 nm (Hitachi, Type No. HL6501MG) and so forth.

Patterned exposure of the silver salt-containing layer may be performed by surface exposure utilizing a photomask or scanning exposure with laser beams. The exposure may be refraction-type exposure using a lens or reflection-type exposure using a reflecting mirror, and exposure methods including contact exposure, proximity exposure, reduction projection exposure and reflecting projection exposure can be employed.

[Development]

In the present invention, the silver salt-containing layer is further developed after the exposure. The development can be performed by using usual development techniques used for silver salt photographic films, photographic paper, films for printing plate making, emulsion masks for photomask and so forth. The developer is not particularly limited, and PQ developer, MQ developer, MAA developer and so forth can be used. For example, developers such as CN-16, CR-56, CP45X, FD-3 and Papitol produced by Fuji Photo Film and C-41, E-6, RA-4, D-19 and D-72 produced by KODAK as well as developers contained in the kits thereof and lith developers such as D85 can be used.

In the present invention, by performing the aforementioned exposure and development, a metal silver portion, preferably a patterned metal silver portion, is formed, and a light-transmitting portion described later is formed at the same time.

The development in the present invention may include fixation performed for removing the silver salt from an unexposed portion for stabilization. The fixation in the present invention can be performed by using fixation techniques used for silver salt photographic films, photographic paper, films for printing plate making, emulsion masks for photomask and so forth.

The developer used for the development can contain an image quality improver for the purpose of improving image quality. Examples of the image quality improver include, for example, nitrogen-containing heterocyclic compounds such as benzotriazole. Further, when a lith developer is used, in particular, polyethylene glycol is also preferably used.

The weight of metal silver contained in an exposed portion after the development is preferably 50% by weight or more, more preferably 80% by weight or more, based on the weight of silver contained in the exposed portion before exposure. If the weight of the silver contained in the exposed portion is 50% by weight or more based on the weight of silver contained in the exposed portion before the exposure, high conductivity can be obtained, and thus such a content is preferred.

Although the gradation after the development is not particularly limited in the present invention, it preferably exceeds 4.0. If the gradation after the development exceeds 4.0, conductivity of the conductive metal portion can be increased with maintaining high transparency of the light-transmitting portion. Examples of the means for obtaining a gradation of 4.0 or more include, for example, the aforementioned doping of rhodium ions or iridium ions.

[Physical Development and Plating]

In the present invention, for the purpose of imparting conductivity to the metal silver portion formed by the aforementioned exposure and development, physical development and/or plating is performed so that conductive metal particles should be carried by the aforementioned metal silver portion. In the present invention, although a metallic portion can be made to carry conductive metal particles by physical development or plating alone, physical development and plating can also be performed in combination to make the metal silver portion carry the conductive metal particles.

The "physical development" referred to in the present invention means deposition of metal particles on nuclei of metal or metal compound by reduction of metal ions such as silver ions with a reducing agent. This physical phenomenon is utilized in instant B & W films, instant slide films, production of printing plates and so forth. In the present invention, techniques used for these can be used.

Further, the physical development may be performed simultaneously with the development after the exposure, or may be separately performed after the development.

In the present invention, as the plating, electroless plating (chemical reduction plating or substitution plating), electrolytic plating, or both of electroless plating and electrolytic plating can be used. For the electroless plating used in the present invention, known electroless plating techniques can be used. For example, electroless plating techniques used for printed wiring boards or the like can be used. The electroless plating is preferably electroless copper plating.

Examples of the chemical species contained in the electroless copper plating solution include copper sulfate, copper chloride, reducing agent such as formalin and glyoxylic acid, ligand of copper such as EDTA and triethanolamine as well as additives for stabilization of the bath and improvement of smoothness of plated film such as polyethylene glycol, yellow prussiate of potash and bipyridine and so forth.

Examples of the electrolytic copper plating bath include copper sulfate bath and copper pyrophosphate bath.

As for the plating rate of the plating used in the present invention, the plating can be performed at a slow rate condition. Further, high-speed plating at a rate of 5 µm/hr or higher can also be performed. In the plating, various additives, for example, ligands such as EDTA and so forth can be used in view of increasing stability of a plating solution.

[Oxidization Treatment]

In the present invention, the metal silver portion after the development and the conductive metal portion formed after the physical development and/or plating are preferably subjected to oxidization. For example, when a small amount of metal is deposited on a light-transmitting portion, this metal can be removed by performing oxidization treatment to attain a transmission of the light-transmitting portion of almost 100%.

Examples of the oxidization treatment include, for example, known methods utilizing various oxidizing agents such as Fe(III) ion treatment. The oxidization treatment can be performed either after the exposure and development of the silver salt-containing layer, or after the physical development or plating thereof. Further, the oxidization treatment may also be performed after development and after physical development or plating.

In the present invention, the metal silver portion after the exposure and development can be further treated with a solution containing Pd. Pd may be a bivalent palladium ion or metal palladium. The rate of electroless plating or physical development can be increased by this treatment.

[Conductive Metal Portion]

Hereafter, the conductive metal portion of the present invention will be explained.

In the present invention, the conductive metal portion is formed by subjecting the aforementioned metal silver portion formed by the exposure and development to the physical development or plating so that the metal silver portion should carry conductive metal particles.

There are a case where the metal silver is formed in an exposed portion, and a case where the metal silver is formed in an unexposed portion. In the silver salt diffusion transfer process utilizing physical development nuclei (DTR method), the metal silver is formed in an unexposed portion. In the present invention, it is preferable to form the metal silver in an exposed portion in order to increase transparency.

Examples of the conductive metal particles to be carried by the aforementioned metal portion include, besides the aforementioned silver, particles of metals such as copper, aluminum, nickel, iron, gold, cobalt, tin, stainless steel, tungsten, chromium, titanium, palladium, platinum, manganese, zinc and rhodium as well as alloys of these. In view of conductivity, price and so forth, conductive metal particles are preferably particles of copper, aluminum or nickel. Further, when a magnetic field-shielding property is imparted, paramagnetic metal particles are preferably used as the conductive metal particles.

As for the aforementioned conductive metal portion, conductive metal particles contained in the conductive metal portion are preferably copper particles, more preferably copper particles at least of which surfaces are blackened, in view of obtaining high contrast and prevention of discoloration of the conductive metal portion due to oxidization with time. The blackening can be performed by using the methods used in the field of printed wiring boards. For example, the blackening can be performed by treatment in an aqueous solution of sodium chlorite (31 g/l), sodium hydroxide (15 g/l) and trisodium phosphate (12 g/l) at 95° C. for 2 minutes.

The aforementioned conductive metal portion preferably contains 50% by weight or more, more preferably 60% by weight or more, of silver based on the total weight of metals contained in the conductive metal portion. If 50% by weight or more of silver is contained, time required for the physical development and/or plating can be reduced, thereby productivity is improved, and the cost is reduced.

Further, when copper and palladium are used for the conductive metal particles used to form the conductive metal portion, the total weight of silver, copper and palladium is preferably 80% by weight or more, more preferably 90% by weight or more, based on the total weight of metals contained in the conductive metal portion.

Since the conductive metal portion used in the present invention carries conductive metal particles, favorable conductivity can be obtained. Therefore, the surface resistance value of the light-transmitting electromagnetic wave-shielding film (conductive metal portion) of the present invention is preferably 10 Ω/sq or lower, more preferably 2.5 Ω/sq or lower, further preferably 1.5 Ω/sq or lower, most preferably 0.1 Ω/sq or lower.

For use as a light-transmitting electromagnetic wave-shielding material, the conductive metal portion of the present invention preferably has a geometric configuration consisting of triangles such as equilateral triangle, isosceles triangle and right triangle, quadrangles such as square, rectangle, rhomboid, parallelogram and trapezoid, (equilateral) n-gons such as (equilateral) hexagon and (equilateral) octagon, circle, ellipse, star and so forth in combination, and is more preferably a mesh consisting of these geometric configurations. In view of EMI-shielding property, triangular shapes are most effective. However, in view of visible light transmission, a larger n of the (equilateral) n-gon provides a higher the aperture ratio and higher visible light transmittance with the same line width, and thus a larger n is more advantageous.

For use as a conductive wiring material, the shape of the conductive metal portion is not particularly limited, and an arbitrary shape can be suitably selected depending on the purpose.

For use as a light-transmitting electromagnetic wave-shielding material, the line width of the aforementioned conductive metal portion is preferably 20 μm or less, and the space between lines is preferably 50 μm or more. Further, the conductive metal portion may have a portion having a line width greater than 20 μm for the purpose of ground connection or the like. Further, in view of making the image less outstanding, the line width of the conductive metal portion is preferably 18 μm or less, more preferably 15 μm or less, still more preferably 14 μm or less, still more preferably 10 μm or less, most preferably less than 7 μm.

In view of visible light transmittance, the conductive metal portion of the present invention preferably has an aperture ratio of 85% or higher, more preferably 90% or higher, most preferably 95% or higher. The aperture ratio is a ratio of portions not having fine lines constituting a mesh with respect to the total area, and for example, the aperture ratio of a mesh in a square grid pattern having a line width of 10 μm and a pitch of 200 μm is 90%.

[Light-Transmitting Portion]

The "light-transmitting portion" referred to in the present invention means a portion having transparency other than the conductive metal portion in the light-transmitting electromagnetic wave-shielding film. As described above, the transmittance of the light-transmitting portion in terms of the minimum transmittance for a wavelength range of 380 to 780 nm excluding change of the transmittance due to light absorption and reflection of the support is 90% or higher, preferably 95% or higher, more preferably 97% or higher, still more preferably 98% or higher, most preferably 99% or higher.

It is preferred that the light-transmitting portion of the present invention does not substantially have physical development nuclei in view of improvement of the transmission. In the present invention, since it is not necessary to dissolve and convert unexposed silver halide to a soluble silver complex compound and then optionally diffuse it, unlike the conventional silver complex salt diffusion transfer processes, the light-transmitting portion does not substantially have physical development nuclei.

The expression "does not substantially have physical development nuclei" used herein means that the existence ratio of the physical development nuclei in the light-transmitting portion is within the range of 0 to 5%.

The light-transmitting portion of the present invention is formed together with the metal silver portion by the exposure and development of the aforementioned silver salt-containing layer. In view of improvement of transmission, the light-transmitting portion is preferably subjected to an oxidization treatment after the aforementioned development and further after the physical development or plating.

[Layer Structure of Light-Transmitting Electromagnetic Wave-Shielding Film]

The thickness of the support in the light-transmitting electromagnetic wave-shielding film of the present invention is preferably 5 to 200 μm, more preferably 30 to 150 μm. If the thickness of the support is within the range of 5 to 200 μm, a desired visible light transmittance can be obtained, and the film can be readily handled.

The thickness of the metal silver portion provided on the support before the physical development and/or plating can be suitably determined depending on the coating thickness of paint for the silver salt-containing layer applied to the support. The thickness of the metal silver portion is preferably 30 μm or less, more preferably 20 μm or less, further preferably 0.01 to 9 μm, most preferably 0.05 to 5 μm. Further, the metal silver portion is preferably patterned. The metal silver portion may consist of one layer or may have a multilayer structure consisting of two or more layers. If the metal silver portion is patterned and has a multilayer structure consisting of two or more layers, different color sensitivities can be imparted for sensitization at different wavelengths. As a result, when exposure is performed with changing the exposure wavelength, a different pattern can be formed in each layer. The light-transmitting electromagnetic wave-shielding film including a patterned metal silver portion having a multilayer structure formed as described above can be utilized as a high density printed wiring board.

For use as an electromagnetic wave-shielding material of a display, a thinner conductive metal portion provides a wider view angle of the display and thus is more preferred. Further, a thinner film is required for higher density for use as a conductive wiring material. In such a view, the thickness of the layer composed of conductive metal carried by the conductive metal portion is preferably less than 9 μm, more preferably 0.1 μm or larger and less than 5 μm, further preferably 0.1 μm or larger and less than 3 μm.

In the present invention, a metal silver portion having a desired thickness can be formed by controlling the coating thickness of the aforementioned silver salt-containing layer, and further the thickness of the layer comprising the conductive metal particles can be freely controlled by the physical development and/or plating. Accordingly, even a light-transmitting electromagnetic wave-shielding film having a thickness of less than 5 μm, more preferably less than 3 μm, can be readily formed.

In the conventional methods using etching, a substantial portion of the metal thin film must be removed by etching and discarded. In the present invention, however, since a pattern containing only a required amount of conductive metal can be formed on the support, only a minimum amount of the metal can be used. Accordingly, advantages are provided in view of both of reduction of production cost and reduction of waste metal amount.

[Functional Film Other than Those for Electromagnetic Wave Shielding]

In the present invention, a functional layer having a function may be additionally provided as required. This functional layer can be produced in various specifications depending on the use. For example, for use as an electromagnetic wave-shielding material for a display, an anti-reflection layer imparted with an anti-reflection function with adjusted refraction index and film thickness, a non-glare and anti-glare layer (both have a glare-preventing function), a near infrared ray-absorbing layer comprising a compound or metal that absorbs near infrared rays, a layer having a color tone adjusting function that absorbs visible lights in a specific wavelength region, an antifouling layer having a function of facilitating removal of stains such as finger prints, a hard coat layer which is hardly damaged, a layer having a function of absorbing impact, a layer having a glass piece scattering-preventing function for the case of crash of glass or the like can be provided.

These functional films may be directly adhered to PDP, or may be adhered to a transparent substrate such as a glass plate or acrylic resin plate separate from the plasma display panel body. These functional films are referred to as optical filters (or simply "filters").

The reflection-preventing layer imparted with the reflection-preventing function is a layer provided for suppressing reflection of external lights to suppress degradation of contrast, and examples of the method for preparing it include a method of laminating an inorganic substance such as metal oxides, fluorides, silicides, borides, carbides, nitrides and sulfides as a single layer or multiple laminated layers by vacuum deposition, sputtering, ion plating, ion beam-assisted deposition or the like, a method of laminating a resin having a different refractive index such as acrylic resins and fluorocarbon resins as a single layer or multiple laminated layers and so forth. Moreover, a film subjected to a reflection-preventing treatment can also be adhered on the filters. Furthermore, if required, a non-glare layer or anti-glare layer can also be provided. In order to prepare the non-glare layer or anti-glare layer, a method of making finely divided powder of silica, melamine, acrylic resin or the like into an ink and coating it on a surface and so forth can be used. For curing of the ink, heat-curing or photo-curing may be used. Moreover, a film subjected to a non-glare treatment or anti-glare treatment can also be adhered to the filters. Furthermore, if it is required, a hard coat layer can also be provided.

The near infrared ray-absorbing layer is a layer containing a near infrared ray-absorbing dye such as metal complex compounds, a silver-spattering layer or the like. As for the silver-spattering layer, if dielectric material layers and the metal layers are alternately laminated on a substrate, irradiations including near infrared rays and far infrared rays as well as electromagnetic waves even in the wavelength range of 1000 nm or more can be shielded. The dielectric material layer is a layer of a transparent metal oxide such as indium oxide and zinc oxide, and the metal layer is generally a silver/palladium alloy layer. These layers are usually laminated in a number of 3, 5, 7 or 11 layers or so starting from the dielectric material layer.

Since the blue light-emitter of PDP has a characteristic that it also emits red color lights in addition to the blue color lights although the red color lights are emitted in a small amount. Therefore, there is a problem that a portion that should be displayed in a blue color is displayed in a purplish color. The layer having a color tone adjusting function that absorbs visible lights in a specific wavelength region is a layer for correcting emitted lights as a countermeasure to the above phenomenon, and it contains a dye absorbing lights having a wavelength of around 595 nm.

The light-transmitting electromagnetic wave-shielding film obtained by the production method of the present invention has a favorable electromagnetic wave-shielding property and transmission, and therefore it can be used as a transmissive electromagnetic wave-shielding material. Further, it can also be used as various conductive wiring materials for circuit wiring and so forth. The light-transmitting electromagnetic wave-shielding film of the present invention can be suitably used as front faces of displays such as CRT (cathode ray tube), PDP (plasma display panel), liquid crystal and EL (electroluminescence) displays, microwave oven, electronic equipment, printed wiring board and so forth, in particular, as a light-transmitting electromagnetic wave-shielding film used in the plasma display panel.

EXAMPLES

The present invention will be explained more specifically with reference to the following examples. The materials, amounts, ratios, treatments, procedures of treatments and so forth described in the following examples can be suitably changed unless the changes depart from the spirit of the invention. Therefore, the scope of the present invention should not be construed in any limitative way based on the following examples.

Example 1

An emulsion containing silver iodobromide grains having an average diameter as sphere of 0.05 μm and 7.5 g of gelatin per 60 g of Ag in an aqueous medium was prepared. The emulsion was prepared so that the Ag/gelatin volume ratio should become 1/1. As the gelatin species, low molecular weight gelatin having an average molecular weight of 20,000 was used. Further, $K_3Rh_2Br_9$ and $K_2IrCl_6$ were added to the emulsion, and the silver bromide grains were doped with Rh ions and Ir ions. This emulsion was added with $Na_2PdCl_4$, further subjected to gold and sulfur sensitization by using chloroauric acid and sodium thiosulfate and then applied to polyethylene terephthalate (PET) together with a gelatin hardening agent so that the applied amount of silver should become 1 g/m$^2$. PET was made hydrophilic beforehand prior to the application. The dried coated film was exposed through a photomask in a grid pattern providing developed silver image of line/space=5 μm/195 μm (photomask of line/space=195 μm/5 μm (pitch: 200 μm) in which spaces constituted the grid pattern) by using an ultraviolet ray lamp, developed with the developer shown below, further developed by using a fixer (Super Fujifix, Fuji Photo Film) and then rinsed with pure water.

[Composition of Developer]

The following compounds were contained in 1 L of developer.

| | |
|---|---|
| Hydroquinone | 0.037 mol/L |
| N-Methylaminophenol | 0.016 mol/L |
| Sodium metaborate | 0.140 mol/L |
| Sodium hydroxide | 0.360 mol/L |
| Sodium bromide | 0.031 mol/L |
| Potassium metabisulfite | 0.187 mol/L |

Further, electroless copper plating was performed by using a copper plating solution, TSP-810 (Okuno Pharmaceutical), with addition of triethanolamine, and then oxidization was performed with an aqueous solution containing Fe(III) ions to obtain Samples A and B according to the present invention.

Further, for comparison with the technique providing the highest conductivity and light transmission among the conventionally known techniques, the metal mesh described in Japanese Patent Laid-open Publication No. 2003-46293 was prepared as a representative of the techniques described in the section of Prior art, (3) Mesh formed by etching utilizing photolithography.

This sample was prepared by performing an experiment similar to that described in Japanese Patent Laid-open Publication No. 2003-46293, Example 1. However, in order to obtain the same mesh shape (line width, pitch) as that of the samples according to the present invention, a photomask having a pitch of 200 μm was used, which was the same as that mentioned above.

As for each of the samples obtained as described above and having a conductive metal portion and a light-transmitting portion, the line width of the conductive metal portion was measured to obtain the aperture ratio, and the surface resistance value was measured.

Further, in order to determine whether the metal fine line mesh adversely affected observation of displayed image, the following evaluation for moire was performed.
(Evaluation of Moire)

Each electromagnetic wave-shielding film was provided on the front faces of PDP produced by Hitachi and PDP produced by Matsushita Electric at a bias angle providing the minimum moire, and a sensory evaluation of moire was performed by visual observation. The viewing point was changed variously with respect to PDPs, and the observation was performed from directions perpendicular to and oblique to the PDP image display surfaces. For the both cases, when moire was not manifested, the evaluation was represented with the symbol of ○, and when moire was manifested, the evaluation was represented with the symbol of X.
(Observation of Shapes of Intersectional Points of Mesh Fine Lines)

The mesh was observed and photographed by using an optical microscope and a scanning electron microscope to observe the shapes of intersectional points of crossing metal fine lines constituting the mesh. When the line width at intersectional points is less than 1.5 times of the line width of straight line portions, it was evaluated that there was no problem concerning thickening of intersectional points (○), and when the line width at intersectional points is 1.5 times or more, it was evaluated that there was a problem concerning thickening of intersectional points (X).

The evaluation results are shown in the following table with the data of the comparative example.

TABLE 1

| Sample | Line width (μm) | Aperture ratio (%) | Surface resistance (Ω/sq) | Moire | Thickening of intersectional points | Note |
|---|---|---|---|---|---|---|
| Sample A | 12 | 88 | 0.06 | ○ | ○ | Invention |
| Sample B | 9 | 91 | 0.1 | ○ | ○ | Invention |
| Repetition of JP-A-2000-46293 | 12 | 86 | 0.06 | X (moire was generated) | X (intersectional points were thick) | Comparative (etching) |

The conventionally known light-transmitting electromagnetic wave-shielding film having the highest quality and comprising a metal mesh was the one described in Japanese Patent Laid-open Publication No. 2003-46293. The light-transmitting conductive film described in Examples of the publication were used as a comparative example.

When the light-transmitting conductive film of Comparative Example and Sample A according to the present invention are compared, the aperture ratio and surface resistance were at a comparable level, and thus it can be seen that the both exhibited light transmission and conductivity (electromagnetic wave-shielding ability) of the same level. However, in view of the image quality of PDP images (moire), the sample according to the present invention was free from that problem, whereas moire was generated in the sample of the comparative example.

In addition, when the shapes of the intersectional points were observed, thickening of the intersectional points was not observed in the sample according to the present invention, whereas the intersectional points were in a shape thicker than the straight line portions in the sample of the comparative example in which a copper foil was etched. It is estimated that the absence and presence of the moire was caused due to the difference of the shapes of intersectional points.

Example 2

Comparison was performed as follows with the silver salt diffusion transfer process in which silver is deposited on physical development nuclei (Japanese Patent Laid-open Publication No. 2000-149773, International Patent Publication WO01/51276 etc.), which is the "method for forming conductive metal silver utilizing silver salt" mentioned in the section of Prior art mentioned above.

A physical development nucleus layer and a photosensitive layer were applied on a support consisting of hydrophilized transparent TAC (triacetyl cellulose), exposed through a mesh photomask having a pitch of 200 μm and developed by the DTR method in the same manner as the method described in Japanese Patent Laid-open Publication No. 2000-149773 to produce Comparative Sample 1.

Further, in the same manner as in Example 1, Sample C according to the present invention was prepared by using a coated sample having a size of 4 cm×4 cm.

As for the mesh shapes of Sample C according to the present invention and Comparative Sample 1, the line width was 12 μm, the pitch was 12 μm, and the both had an aperture ratio of 88%.

The measurement results of transmittance of light-transmitting portions and surface resistance are shown in the following table.

TABLE 2

| Sample | Surface resistance (Ω/sq) | Transmittance of light-transmitting portion (%) | Presence or absence of physical development nuclei | Note |
|---|---|---|---|---|
| Sample C | 0.06 | 99 | Absent | Invention |
| Comparative Sample 1 | 80 | 89 | Present | Invention |

Based on these results, it can be seen that the light-transmitting electromagnetic wave-shielding film of the present invention has higher conductivity and superior light transmittance compared with the conductive metal film obtained by the silver salt diffusion transfer process utilizing physical development nuclei described in Japanese Patent Laid-open Publication No. 2000-149773.

As described above, it is difficult to obtain a sufficiently transparent electromagnetic wave-shielding film as one to be provided on a front surface of display by the method utilizing the silver salt diffusion transfer process described in Japanese Patent Laid-open Publication No. 2000-149773 or the like in view of transparency of the light-transmitting portion, and a method in which physical development nuclei are not applied can provide a shielding film of high transparency and thus is more suitable for use in displays.

Example 3

In order to show that a high Ag/gelatin volume ratio is an important factor for obtaining higher conductivity when the conductive metal portion is obtained without utilizing the silver salt diffusion transfer process, the following experiment was conducted.

The amount of gelatin used in Example 1 was changed to prepare Samples D to G according to the present invention in which the Ag/gelatin volume ratio is 1/4 to 1/0.6, the line width of metal fine lines constituting the mesh was 12 μm, and the aperture ratio was 88%. The surface resistance was measured in the same manner as in Example 1 of the present specification.

Moreover, a case where a usual negative color film was used will be described for comparison. Since the Ag/binder (gelatin) volume ratio of a commercial negative color film is extremely small, i.e., about 1/17, the amount of gelatin used in Example 1 was changed to prepare Sample C having an Ag/gelatin volume ratio of 1/17. An experiment similar to that of Examples 1 and 2 described in the present specification was performed to measure the surface resistance etc.

The results are shown in the following table.

TABLE 3

| Sample | Ag/gelatin (volume ratio) | Surface resistance | Aperture ratio (%) | |
| --- | --- | --- | --- | --- |
| Sample D | 1/17 | 540 | 88 | Invention |
| Sample E | 1/4 | 60 | 88 | Invention |
| Sample F | 1/3 | 1.1 | 88 | Invention |
| Sample G | 1/2 | 0.2 | 88 | Invention |
| Sample H | 1/1 | 0.06 | 88 | Invention |
| Sample I | 1/0.6 | 0.04 | 88 | Invention |

It can be seen that, in the present invention, higher conductivity can be obtained by increasing the Ag/binder (gelatin) volume ratio. Further, also in view of transmittance, it is preferable to increase the Ag/binder volume ratio.

For use in CRT requiring a conductivity of 300 Ω/sq or less, the Ag/gelatin ratio is preferably 1/4 or more, and for use in PDP requiring a conductivity of 2.5 Ω/sq, the Ag/gelatin ratio is preferably 1/3 or more.

Further, if a light-sensitive material having a small Ag/gelatin ratio such as a usual negative color film is used, it is difficult to provide conductivity sufficient for a light-transmitting electromagnetic wave-shielding material, even though a conductive pattern can be formed.

As described above, if the production method of the present invention is used, a light-transmitting electromagnetic wave-shielding film that simultaneously satisfies high transmittance and high conductivity (electromagnetic wave-shielding ability) and is free from the problem of moire can be obtained. Further, if the production method of the present invention is used, a production method of further higher productivity can be utilized, and as a result, light-transmitting electromagnetic wave-shielding films can be produced in a large amount at a low cost.

The present disclosure relates to the subject matter contained in Japanese Patent Application No. 378967/2002 filed on Dec. 27, 2002 and Japanese Patent Application No. 422442/2003 filed on Dec. 19, 2003, which are expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A method for producing a metal silver pattern, comprising exposing and developing a silver halide-containing layer, which contains a silver halide and is provided on a support, to form the metal silver pattern,
   wherein the silver halide-containing layer contains Ag and a binder and has an Ag/binder volume ratio of 1/1 or higher, and
   the silver halide-containing layer is developed with a development technique used for a silver halide photographic film.

2. The method according to claim 1, wherein the silver halide consists mainly of silver bromide.

3. The method according to claim 1, wherein the silver halide contains a rhodium compound and/or an iridium compound.

4. The method according to claim 1, wherein the silver halide contains Pd(II) ions and/or Pd metal.

5. The method according to claim 1, wherein the silver halide-containing layer has an Ag/binder volume ratio of 1/1 to 2.

6. The method according to claim 1, wherein the silver halide in the silver halide-containing layer has a diameter as sphere of 0.1 to 100 nm, wherein diameter as sphere means the diameter of a particle of silver halide having a spherical shape and the same volume.

7. The method according to claim 1, wherein the developer used for the development of the silver halide-containing layer is a lith developer.

8. The method according to claim 1, wherein an exposed portion after the development contains metal silver at a content of 50% by weight or more based on the weight of silver contained in the exposed portion before the exposure.

9. The method according to claim 1, further comprising subjecting the metal silver pattern to electroless plating to form a conductive metal pattern comprising the metal silver portion carrying conductive metal particles.

10. The method according to claim 9, wherein the surface of the conductive metal pattern is subjected to a blackening treatment.

11. The method according to claim 1, further comprising subjecting the metal silver pattern to physical development and/or electroless plating to form a conductive metal pattern comprising the metal silver portion carrying conductive metal particles, and
   wherein the conductive metal pattern has a surface resistance of 2.5 Ω/sq or lower.

12. The method according to claim 1, wherein the support is a plastic film, a plastic plate or a glass plate.

13. The method according to claim 1, additionally comprising removing silver halide from unexposed regions of the silver halide-containing layer.

14. The method according to claim 1, wherein the silver halide functions as an optical sensor.

15. The method according to claim 1, wherein the binder includes water-soluble polymers.

16. The method according to claim 1, wherein the binder includes gelatin.

17. The method according to claim 1, additionally comprising fixing the developed and exposed silver halide-containing layer.

18. The method according to claim 1, wherein the metal silver pattern has an aperture ratio of 85% or higher.

* * * * *